United States Patent
Pae et al.

(10) Patent No.: US 7,755,140 B2
(45) Date of Patent: Jul. 13, 2010

(54) PROCESS CHARGING AND ELECTROSTATIC DAMAGE PROTECTION IN SILICON-ON-INSULATOR TECHNOLOGY

(75) Inventors: Sangwoo Pae, Beaverton, OR (US); Jose Maiz, Portland, OR (US)

(73) Assignee: Intel Corporation, Santa Clara, CA (US)

(*) Notice: Subject to any disclaimer, the term of this patent is extended or adjusted under 35 U.S.C. 154(b) by 703 days.

(21) Appl. No.: 11/593,706

(22) Filed: Nov. 3, 2006

(65) Prior Publication Data

US 2008/0105925 A1   May 8, 2008

(51) Int. Cl.
*H01L 23/62* (2006.01)

(52) U.S. Cl. .............. 257/347; 257/334; 257/348; 257/350; 257/354; 257/355; 257/360; 257/E21.561; 257/E21.564; 257/E27.112; 257/E31.096; 438/196; 438/197; 438/199; 438/200; 438/201; 438/311

(58) Field of Classification Search .......... 257/334, 257/347–357, 360, 507, E21.32, E21.545, 257/E21.561, E21.564, E27.112, E31.096; 438/196, 197, 199–201, 311
See application file for complete search history.

(56) References Cited

U.S. PATENT DOCUMENTS 6,972,478 B1 * 12/2005 Waite et al. ............. 257/627

OTHER PUBLICATIONS

Voldman, S., et al., "Electrostatic Discharge (ESD) Protection in Silicon-on-Insulator (SOI) CMOS Technology with Aluminum and Copper Interconnects in Advanced Microprocessor Semiconductor Chips", IEEE EOS/ESD Symposium, pp. 105, 1999.
Voldman, S., et al., "Dynamic Threshold Body- and Gate-Coupled SOI ESD Protection Networks", IEEE EOS/ESD Symposium, pp. 210-220, 1997.

* cited by examiner

*Primary Examiner*—Lynne A Gurley
*Assistant Examiner*—Meiya Li
(74) *Attorney, Agent, or Firm*—Scott M. Lane (57) ABSTRACT

A SOI device features a conductive pathway between active SOI devices and a bulk SOI substrate. The conductive pathway provides the ability to sink plasma-induced process charges into a bulk substrate in the event of process charging, such as interlayer dielectric deposition in a plasma environment, plasma etch deposition, or other fabrication provides. A method is also disclosed which includes dissipating electrostatic and process charges from a top of a SOI device to the bottom of the device. The top and bottom of the SOI device may characterize a region of active devices and a semiconductor method respectively. The method further includes a single masking step to create seed regions for an epitaxial-silicon pathway.

8 Claims, 9 Drawing Sheets

PROCESS CHARGING AND ELECTROSTATIC DAMAGE PROTECTION IN SILICON-ON-INSULATOR TECHNOLOGY

FIELD

Embodiments relate generally to the field of semiconductor manufacturing, and more specifically, to semiconductor devices and methods to fabricate the device.

BACKGROUND

In bulk substrate technology, plasma process charging damage on high antenna ratio nodes is typically prevented by the addition of diodes and gate-diode transistors. In silicon-on-insulator (SOI) technology, active SOI device regions are isolated from bulk substrates by buried oxide layers. Because SOI device regions are not directly connected to bulk substrates (i.e., there is an insulator that provides separation), SOI devices rely on equilibrium potential build up across gate and source/drain regions for process charge protection. In other words, build up charge generated during plasma processing environment is inhibited from dissipating due to an insulator region disposed on a SOI substrate. In many cases, non-equilibrium potential build up across gates and source/drain regions causes potential charging problems in scaled technologies as device dimensions continue to shrink. Additionally, as antenna ratios continue to increase, unbalanced-electron shading perturbs gate-to-channel equipotential typically resulting in higher process charging damage problems in SOI technology.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Semiconductor devices and methods to fabricate the devices are described. For an embodiment, a SOI device features a conductive pathway between active SOI devices and a bulk SOI substrate. The conductive pathway provides the ability to sink plasma-induced process charges into a bulk substrate in the event of process charging, such as interlayer dielectric deposition in a plasma environment, plasma etch and deposition, or other fabrication processes. It also provides protection during the event of electrostatic discharge (ESD) damage. For an embodiment, process charge protection and/or electrostatic discharge protection is achieved by sinking charges through an epitaxially formed silicon pathway to a bulk SOI substrate. Also described is a method to form a SOI device featuring process charge and ESD charge protection, which can include a single masking step to create seed regions for an epitaxial-silicon access. For some embodiments, active and planar devices are created at approximately the same surface height to prevent lithography constraints for scaled technology.

Additionally, a method is described to dissipate current in a SOI device caused by process charging or electrostatic dicharge. This method includes channeling charges from a top of a SOI device to a bottom of the device. For an embodiment, the top of a SOI device characterizes a region of active devices, isolation regions, and layers of metallization and a bottom of a SOI device characterizes a semiconductor substrate.

Figure 1:
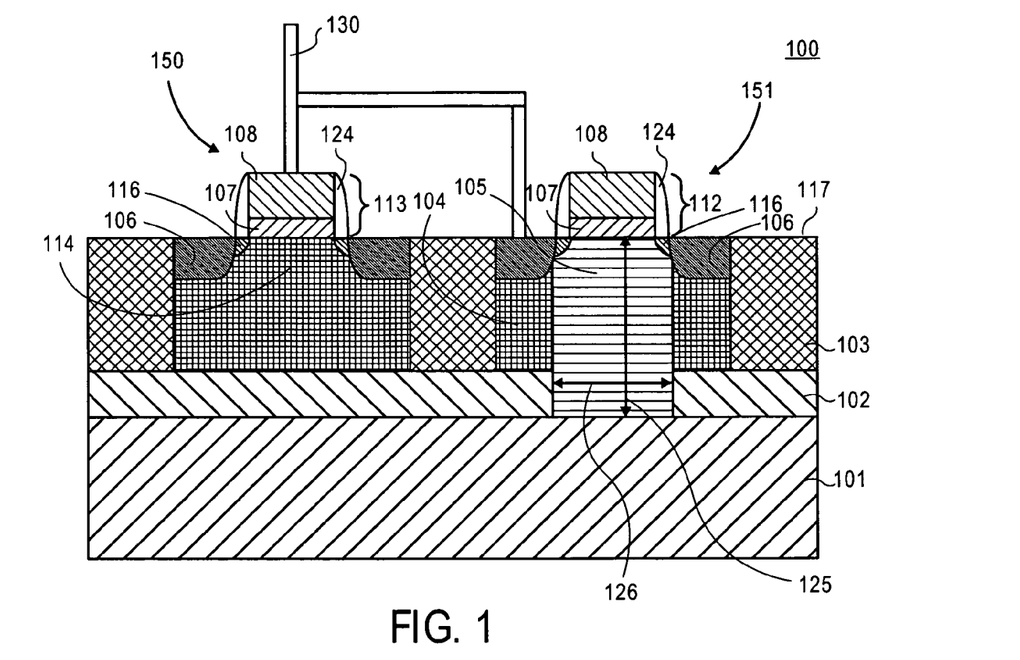
FIG. 1 shows a cross-section of a SOI device, which features a gate-transistor diode, which features process charge and ESD (electrostatic discharge) damage protection, according to an embodiment.

FIG. 1 shows a cross section of a SOI device 100, featuring a transistor 150 and a gate-transistor diode 151. For the embodiment shown, SOI device 100 features a buried oxide layer 102 adjacent to a semiconductor substrate 101 and a field oxide layer 103. SOI device 100 also features semiconductor regions 104, 114 adjacent to field oxide layer 103.

As shown in FIG. 1, first and second semiconductor regions 104, 114 have diffusion regions (source/drain regions 106 and tip implant regions 116) disposed within. Additionally, a first gate stack 112 and a second gate stack 113, having a gate dielectric layer 107 and a gate electrode 108, are disposed above first and second semiconductor regions 104, 114. FIG. 1 further illustrates gate stacks 112, 113, which couples to diffusion regions 106/116. For embodiments, diffusion regions 106/116 are source and drain regions such that coupling gate stacks 112, 113 forms a transistor 150 and a gate-transistor diode 151. As shown, a transistor 150 is formed by coupling gate stack 113 to diffusion regions 106/116 as shown in FIG. 1. Likewise, a gate-transistor diode 151 is formed by coupling gate stack 112 to diffusion regions 106/116.

For embodiments, first transistor 150 is referred to as a victim device and gate-transistor diode 151 is referred to as a protection device. For example, transistor 150 can serve primarily to provide logic functions typically performed by conventional transistors and gate-transistor diode 151 can function to enable process charge and ESD damage protection for transistor 150.

FIG. 1 also shows interconnects 130 coupled to both transistor 150 and gate-transistor diode 151. As shown, interconnects 130 are connected to the top of gate stack 113 (of transistor 150) and the surface of source/drain regions 106 (of gate transistor diode 151).

For some embodiments, gate-transistor diodes are located adjacent to transistors and active devices within SOI device 100. For other embodiments, gate-transistor diodes are not adjacent to a transistor or other active devices, however, but are coupled together by interconnects.

Additionally, semiconductor regions 104, 114 can be doped with implants to a pre-determined polarity (p-type or n-type) and concentration to form n-wells or p-wells for a PMOS or NMOS transistor, respectively. Furthermore, the portion of the wells between the source and drain regions forms a channel region therein.

Additionally, first semiconductor region 104 has an additional feature of a process charge or electrostatic-charge conductive path 105, disposed within, that extends through first semiconductor region 104 to semiconductor substrate 101. For embodiments, charge-conductive path 105 dissipates charges induced in a SOI device by plasma processing or ESD events.

Charge-conductive path 105 comprises any suitable material that allows current to flow throughout and dissipate in semiconductor substrate 101. For an embodiment, charge-conductive path 105 forms a path of silicon that extends from a top surface 117 to semiconductor substrate 101. For various embodiments, charge-conductive path 105 comprises a semiconductor material, such as silicon, or silicon-germanium. For embodiments, charge-conductive path 105 comprises a material that is in the same class of materials as that of first semiconductor region 104. For example, if first semiconductor region 104 comprises a semiconductor material, such as silicon, then charge-conductive path 105 also comprises a semiconductor material.

As shown by the arrows in FIG. 1, charge-conductive path 105 has a length 125 and a width 126. The length 125 and width 126 of charge-conductive path 105 ranges from 100 to 3000 angstroms and 100 angstroms to several microns, respectively. For an embodiment, charge-conductive path 105 has a length 125 and width 126 that is approximately 1000 angstroms and 2500 angstroms, respectively.

Figure 2:
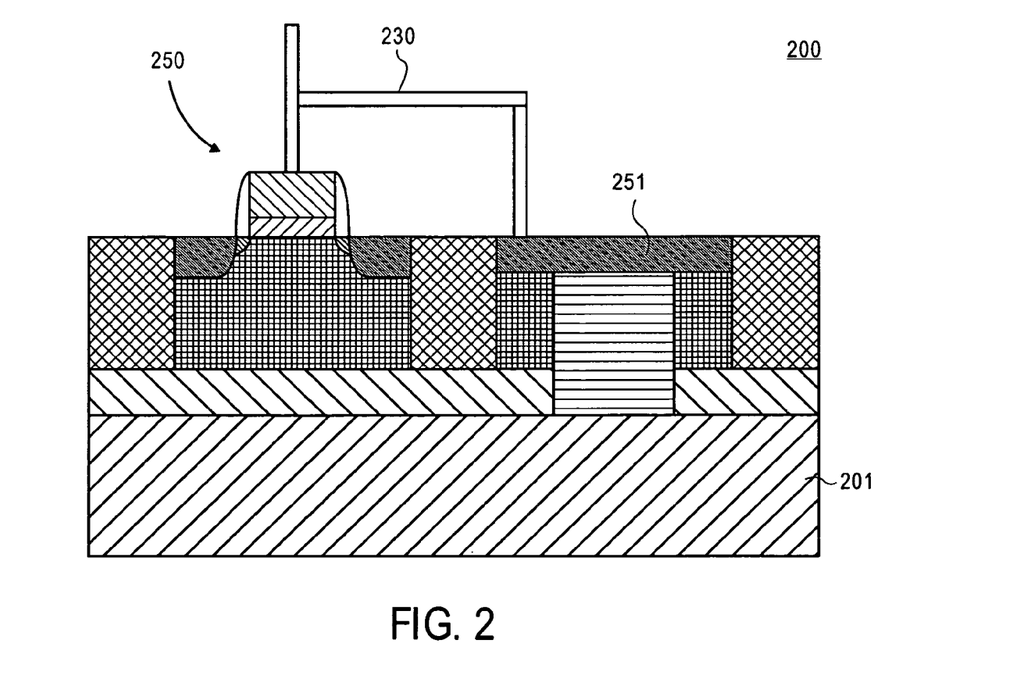
FIG. 2 shows a cross-section of a SOI device having a diffusion diode, which features process charge and ESD damage protection circuitry, according to an embodiment.

FIG. 2 also shows a cross-section of a SOI device 200 featuring process charge and ESD damage protection circuitry. As shown, SOI device 200 features a diffusion diode 251 that provides a path for current produced during plasma processing. For an embodiment, diffusion diode 251 functions similarly to gate-transistor diode 151 (from FIG. 1) by providing a protection mechanism for transistor 250. For example, in the event of electrostatic discharge, electrostatic charges travel through SOI device 200 via interconnects 230 and dissipates in semiconductor substrate 201.

Figure 3:
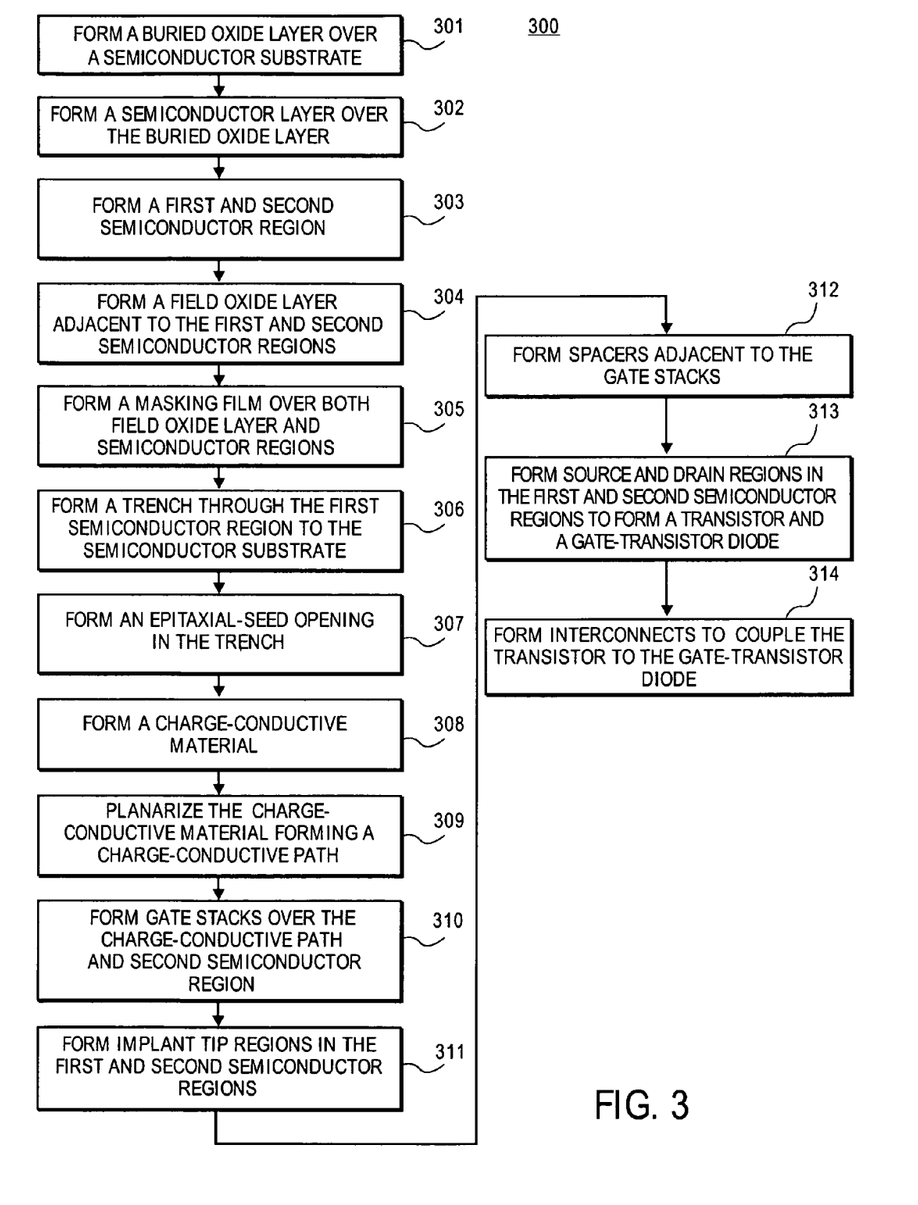
FIG. 3 shows a flowchart 300 of operations 301-313 for a method of fabricating a SOI device that features process charge and ESD damage protection, according to an embodiment.

FIG. 3 shows a flowchart 300 of a process for fabricating a SOI device that features process charge and ESD damage protection circuitry. The process is defined as operations 301 through 313 as shown in FIG. 3.

Figure 4:
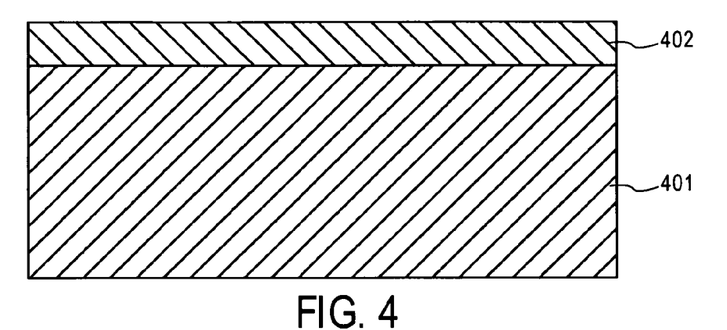
FIGS. 4-20 show cross-sections illustrating a method for fabricating a SOI device, featuring process charge and ESD protection circuitry, according to an embodiment.

FIG. 4 shows a cross-sectional view of the start of a fabrication process for a SOI device featuring process charge and ESD damage protection circuitry according to a process embodiment defined by operation 301. As shown, a buried oxide layer 402 is formed over a semiconductor substrate 401. Buried oxide layer 402 contains a dielectric material or any other material that electrically isolates subsequently-formed active devices from semiconductor substrate 401. For example, buried oxide layer 402 comprises silicon dioxide. Buried oxide layer 402 can be formed over semiconductor substrate 401 by various methods.

For example, buried oxide layer 402 is formed over semiconductor substrate 401 by a silicon-on-insulation or a separation-by-implantation-of-oxygen method. For some embodiments, buried oxide layer 402 is pre-formed over semiconductor substrate 401 prior to fabricating a SOI device.

Buried oxide layer 402 is formed to a suitable thickness such that subsequently-formed active layers are sufficiently isolated electrically and/or physically from semiconductor substrate 401. For example, buried oxide layer 402 is formed to a thickness in the range from 100 to 2000 angstroms.

Figure 5:
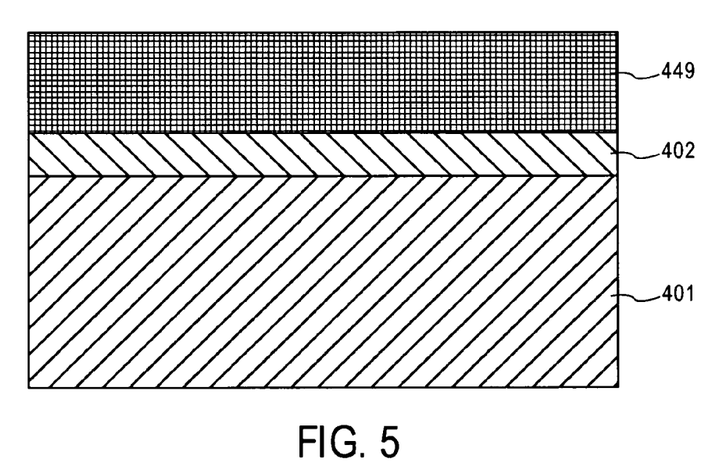

Next, as shown in FIG. 5, a semiconductor layer 449 is formed over buried oxide layer 402, according to operation 302. Semiconductor layer 449 can comprise an amorphous, mono-crystalline, polycrystalline, slightly-doped, and/or heavily-doped silicon. For embodiments, semiconductor layer 449 is mono-crystalline. Semiconductor layer 449 is formed by various methods known in the art. For example, semiconductor layer 449 is formed over buried oxide layer 402 by a chemical vapor deposition process. Plasma vapor deposition (sputtering) and atomic layer deposition are alternative methods which is used to form semiconductor layer 449.

Semiconductor layer 449 can be formed to a thickness in the range from 10 to several microns. For an embodiment, semiconductor layer 449 is formed to a thickness of approximately 1000 angstroms.

Figure 6:
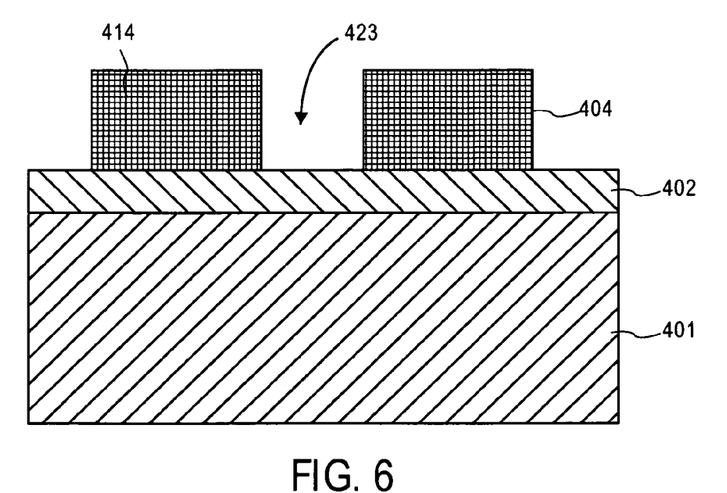

Then, according to operation 303, semiconductor regions 404, 414 are formed from semiconductor layer 449. Conventional lithography-etch techniques known in the art can be used to form semiconductor regions 404, 414 (not shown). Accordingly, openings 423 are shown in FIG. 6 as a result of the formation of semiconductor regions 404, 414.

Figure 7:
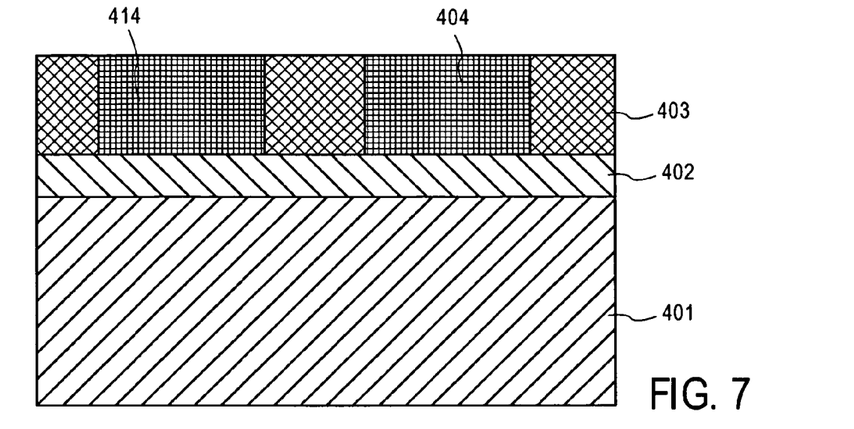

After semiconductor regions 404, 414 are formed from semiconductor layer 449 an insulating material is formed in openings 423 as shown in FIG. 7, according to operation 304. For the embodiment shown, a field oxide layer 403 is formed in openings 423. For embodiments, a field oxide layer 403 comprises silicon dioxide. Field oxide layer 403 can be formed by an oxidation or deposition technique. For an embodiment, field oxide 403 is formed by an oxide deposition process.

On occasion when formed, field oxide layer 403 exceeds the height of semiconductor regions 404, 414 such that chemical mechanical planarization (not shown) is used to polish back field oxide layer 403 to the level of semiconductor regions 404, 414.

Figure 8:
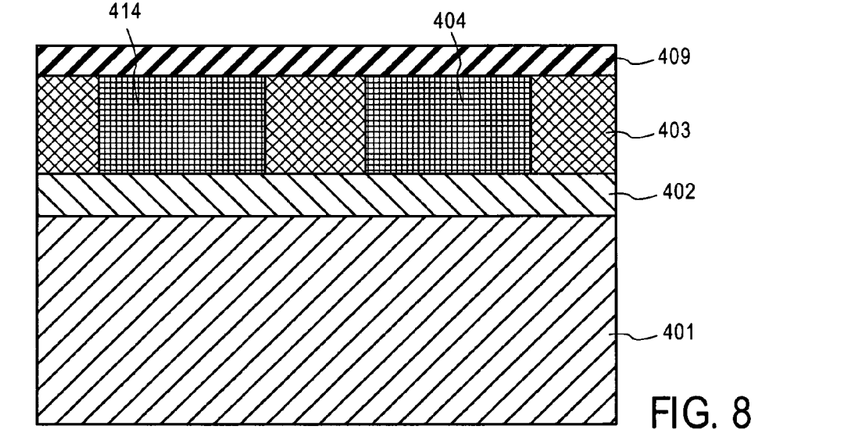

Next, as shown in FIG. 8, a masking film 409 is formed over the top surface of field oxide layer 403 and semiconductor regions 404, 414 according to operation 305. For an embodiment, masking film 409 serves as an etch-stop during a subsequent planarization process and prevents the growth of semiconductor material during a later epitaxial process by covering SOI region 414. Accordingly, the composition of masking film 409 is chosen to best suit the function of an etch-stop. For an embodiment, masking film 409 comprises silicon nitride.

Masking film 409 is formed by a deposition technique, such as, but not limited to chemical vapor deposition, physical vapor deposition, or atomic layer deposition. For an embodiment, masking film 409 is formed by a chemical vapor deposition technique.

Masking film 409 is formed to a suitable thickness such that masking film 409 adequately functions as an etch-stop. Masking film 409 can be formed to a thickness in the range of 100 to 1000 angstroms. For an embodiment, masking film 409 is formed to a thickness of approximately 500 angstroms.

Figure 9:
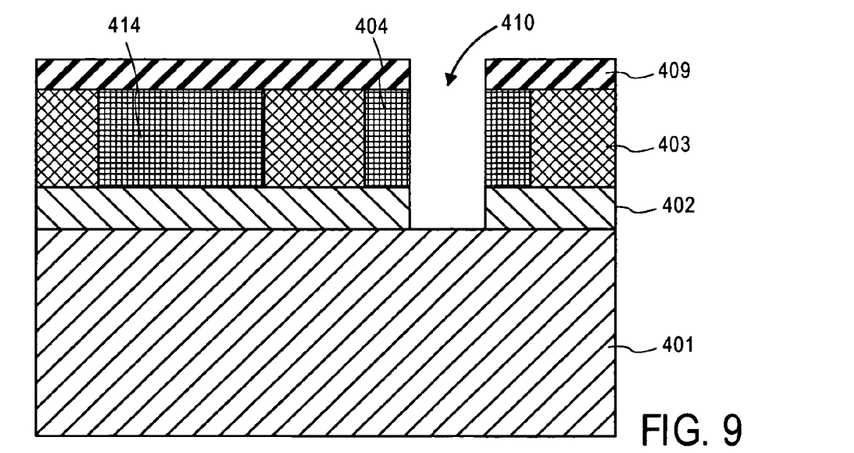

Then, according to operation 306, a trench 410 is formed through masking layer 409, first semiconductor region 404, and buried oxide layer 402 and extends to semiconductor substrate 401 as shown in FIG. 9. For embodiments, trench 410 is formed by conventional lithography-etch processes (not shown).

Figure 10:
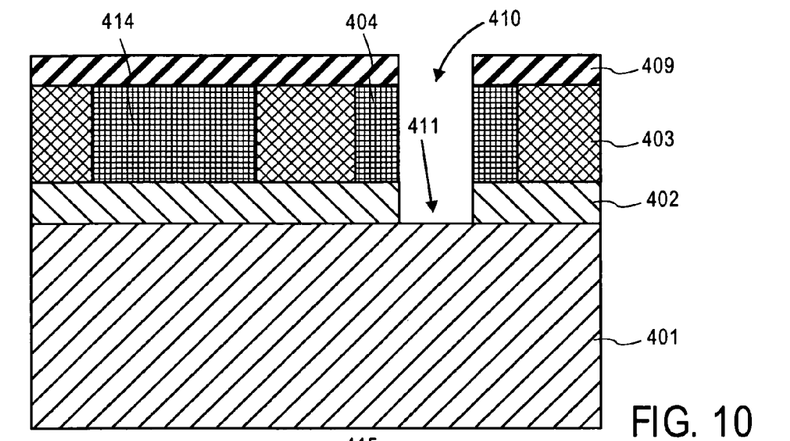

Next, as shown in FIG. 10, an epitaxial-seed opening 411 is formed in trench 410 on the exposed semiconductor substrate 401, according to operation 307. For an embodiment, epitaxial-seed opening 411 comprises the underlying substrate material (silicon).

Figure 11:
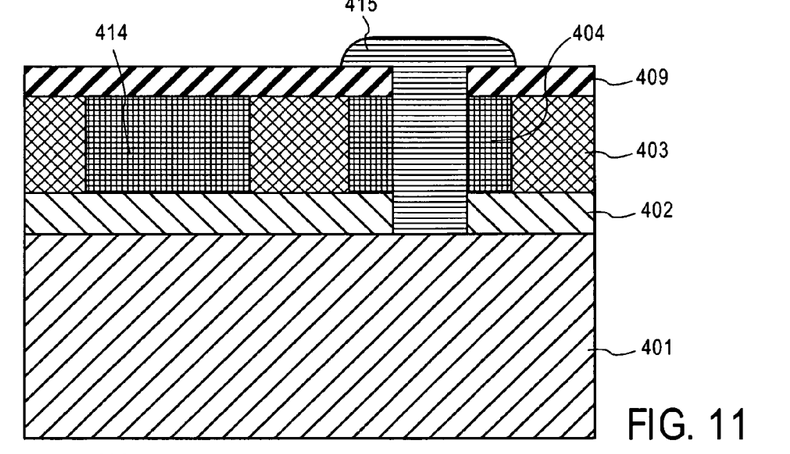

FIG. 11 shows a charge-conductive material 415 formed in trench 410 according to operation 308. For an embodiment, charge-conductive material 415 comprises silicon and is formed by an epitaxial process, such that a mono-crystalline silicon layer is formed within trench 410. For embodiments when an epitaxial process is used, charge-conductive material 415 exceeds both trench 410 and masking layer 409, necessitating the need to remove the excess charge-conductive material 415 by a planarization process.

Figure 12:
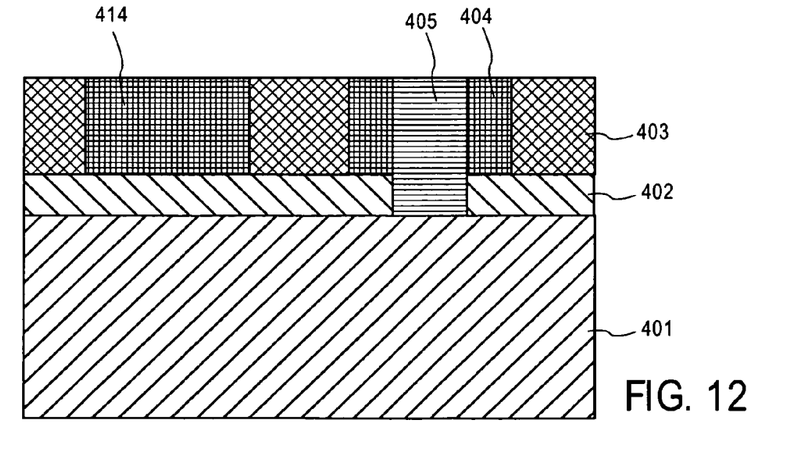

For an embodiment, charge-conductive material 415 is planarized by a chemical-mechanical-polish process, according to operation 309. For other embodiments, charge-conductive material 415 is removed by a wet-etch process. As shown in FIG. 12, after charge-conductive material 415 is planarized a polished charge-conductive path 405 remains. For embodiments, masking layer 409 is also removed when charge-conductive material 415 is planarized. For other embodiments, masking layer 409 is removed during a subsequent etch process after planarizing charge-conductive material 415.

Figure 13:
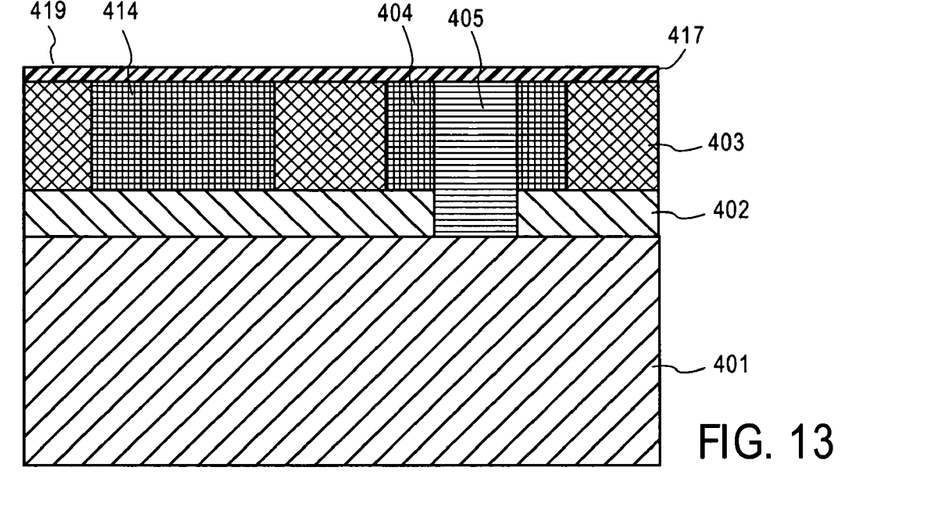

Next, according to operation 310, a gate stack having a gate dielectric and gate electrode is formed over charge-conductive path 405 and second semiconductor region 414. First, according to an embodiment, a gate dielectric material 419 is formed on a top surface 417, which covers charge-conductive path 405, first semiconductor region 404, second semiconductor region 414, and field oxide layer 403 as shown in FIG. 13.

For embodiments, gate dielectric material 419 is a high-k gate dielectric material. For these embodiments, gate dielectric material 419 comprises hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate or a combination of the aforementioned materials.

Gate dielectric material 419 can be formed over top surface 417 by any suitable deposition process such as chemical vapor deposition, sputtering, or atomic layer deposition. For an embodiment, a chemical vapor deposition method is used to form gate dielectric material 419 over top surface 417.

Gate dielectric material 419 can be formed to a thickness in the range from 8 to 50 angstroms. For an embodiment, gate dielectric material 419 has a thickness of approximately 12 angstroms.

Figure 14:
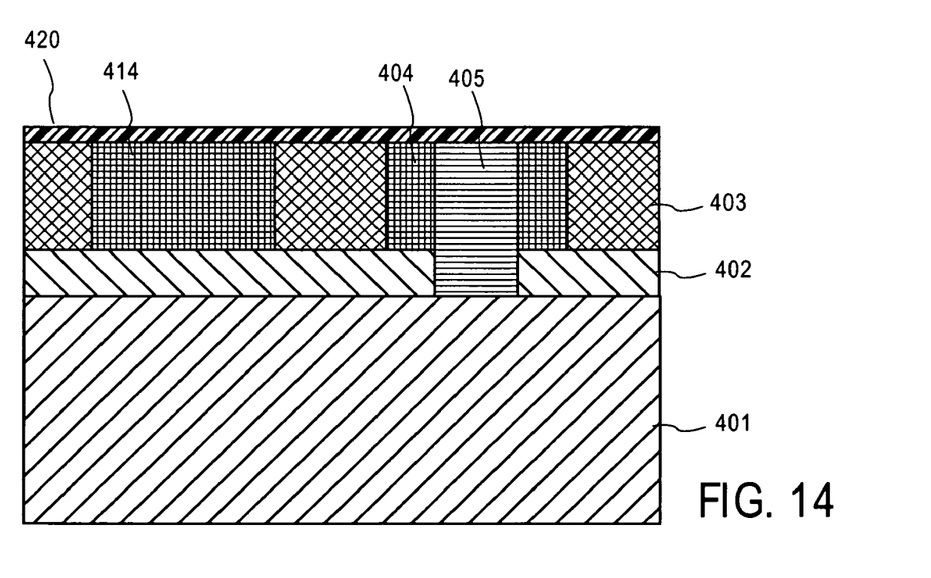

Next, according to an embodiment, gate dielectric material 419 is annealed post deposition to form annealed-gate dielectric material 420. For an embodiment, gate dielectric material 419 is annealed at temperatures greater than or equal to 600° C. As shown in FIG. 14, annealed gate dielectric material 420 illustrates more defined diagonal lines (relative to the diagonal lines illustrated in FIG. 13), to indicate the anneal.

Figure 15:
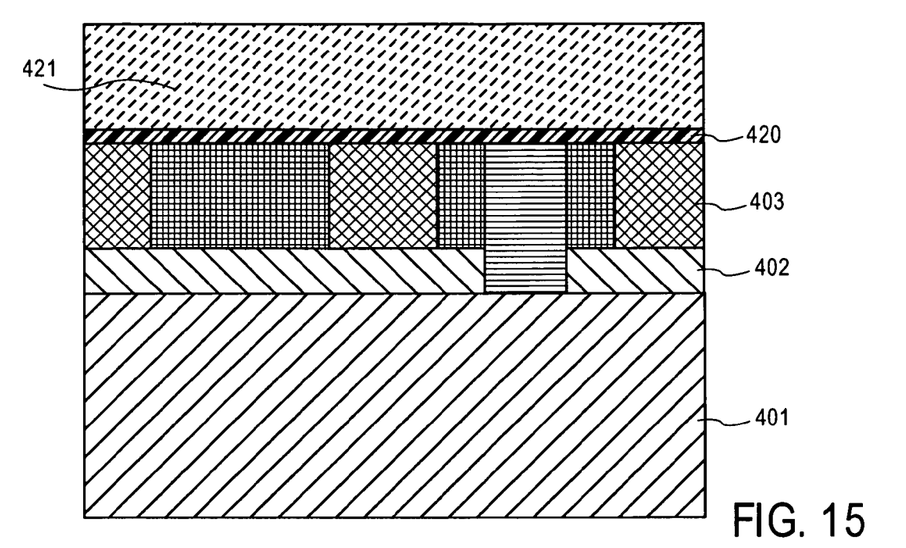

Following an anneal, a gate electrode material 421 is formed on annealed gate dielectric material 420 as shown in FIG. 15. Additionally, gate electrode material 421 comprises a polysilicon material. For other embodiments, gate electrode material 421 comprises a metal or metallic compound.

For an embodiment, gate electrode material 421 is formed on annealed gate dielectric material 420 by a deposition process. For example, gate electrode material 421 is formed by a chemical vapor deposition process. For other embodiments, gate electrode material 421 can be formed on annealed gate dielectric material 420 by other suitable processes such as physical vapor deposition.

Figure 16:
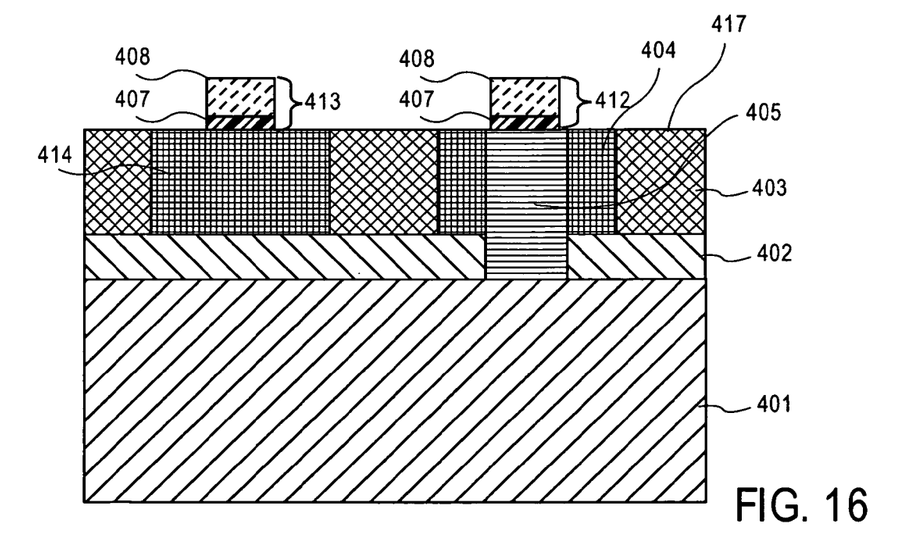

Next, gate stacks 412, 413 are formed over semiconductor regions 404, 414 by removing sections from gate electrode material 421 and annealed gate dielectric material 420 by conventional lithography-etch techniques (not shown).

Additionally, semiconductor regions 404, 414 and charge-conductive path 405 can be doped with implants to a pre-determined polarity (p-type or n-type) and concentration to form n-wells or p-wells for a PMOS or NMOS transistor, respectively. Furthermore, the portion of the wells between the source and drain regions forms a channel region therein.

Figure 17:
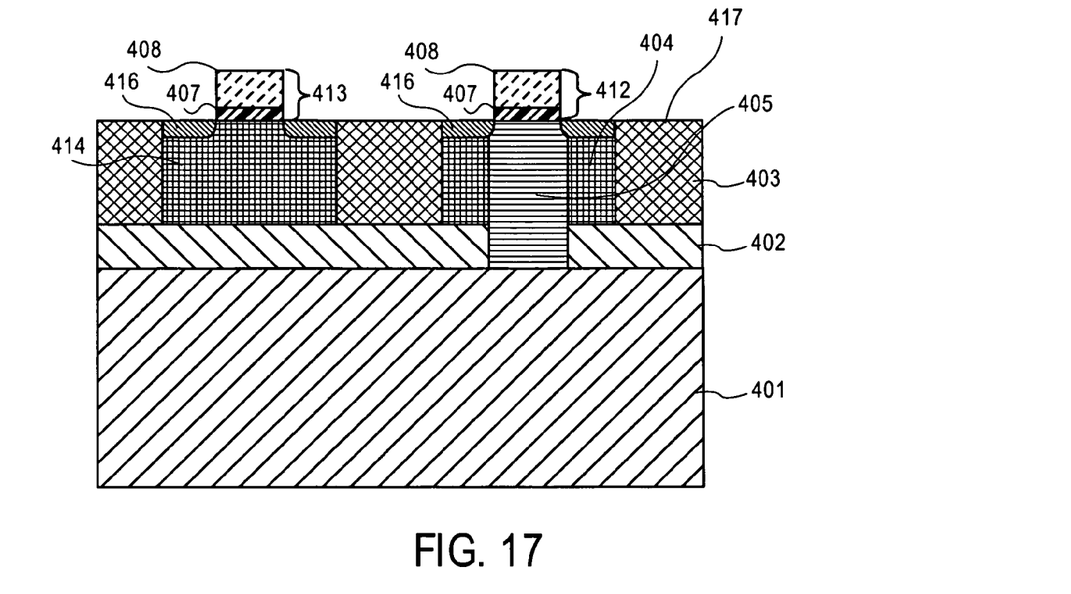

Next, according to operation 311, tip regions 416 are formed in semiconductor regions 404, 414 as illustrated in FIG. 17. Tip regions 416 can be formed by an implantation process such that dopants of a pre-determined polarity are buried within semiconductor regions 404, 414 to a pre-determined depth.

Figure 18:
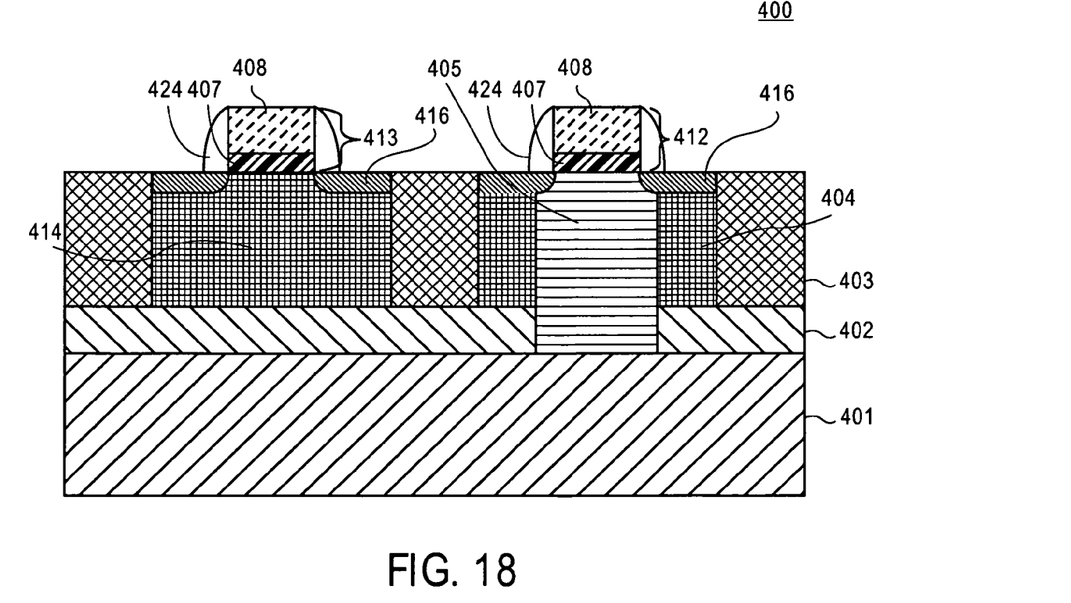

Additionally, according to operation 312, spacers 424 are formed adjacent to gate stacks 412, 413 as shown in FIG. 18. Spacers 424 electrically isolates gate stacks 412, 413 from each other and offset source/drain implants from prior tip implants. For embodiments, spacers 424 comprises silicon dioxide or silicon nitride. Spacers 424 is formed by conventional deposition processes.

Figure 19:
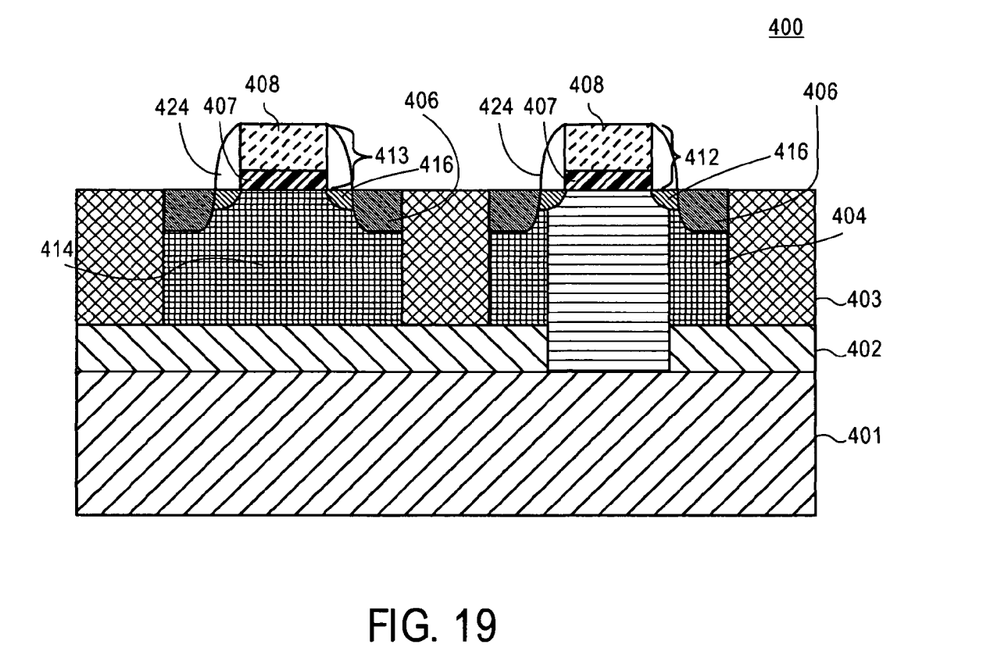

Then, according to operation 313, semiconductor regions 404, 414 are implanted with dopants to form source and drain region 406 as illustrated in FIG. 19. For an embodiment, source and drain regions 406 are doped to a pre-determined concentration and polarity (i.e. doped p-type or n-type).

Figure 20:
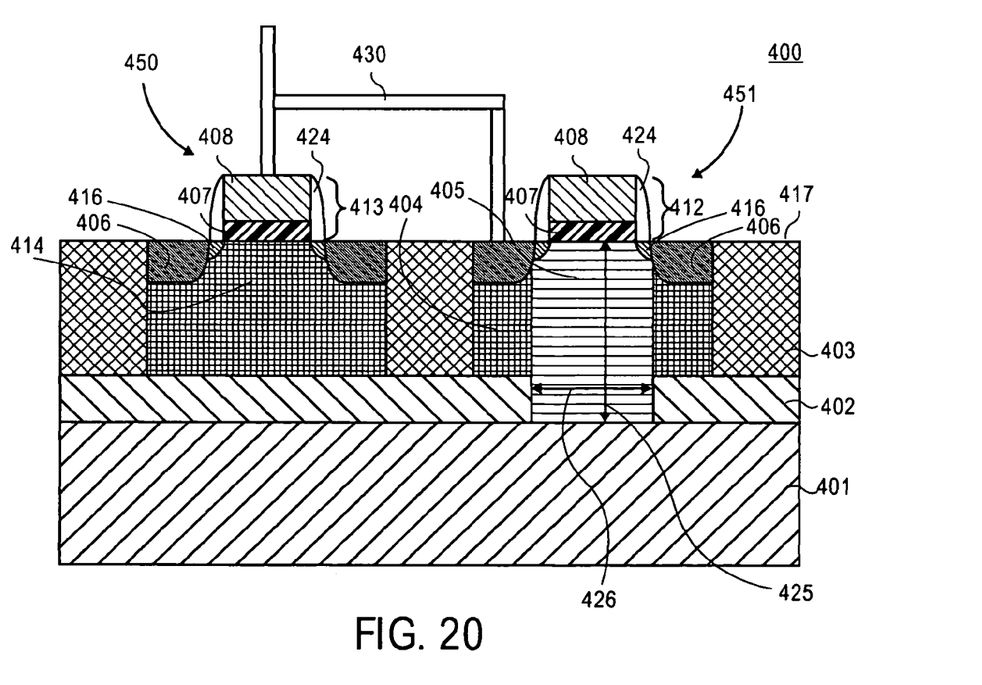

Finally, interconnects 430 are formed to couple transistor 450 to gate transistor diode 451. As shown in FIG. 20, interconnects 430 are connected on top of gate electrode 408 of transistor 450 and on the surface of source/drain regions 406 of gate-transistor diode 451.

In the foregoing specification, the invention has been described with reference to specific exemplary embodiments thereof. It will be evident that various modifications may be made thereto without departing from the broader spirit and scope of the invention. The specification and drawings are, accordingly, to be regarded in an illustrative sense rather than a restrictive sense.

What is claimed is:

1. A silicon-on-insulator device, comprising:
a top side comprising active devices, isolation regions, and layers of metallization, wherein the active devices include a diode on a first semiconductor region and a transistor on a second semiconductor region;
a bottom side comprising a semiconductor substrate;
an insulator positioned between the first semiconductor region and the second semiconductor region;
a buried oxide layer between the top side and the bottom side, wherein the buried oxide layer isolates the diode of the first semiconductor region and the second semiconductor region from the semiconductor substrate;
a conductive path positioned within the first semiconductor region, the conductive path extending from the diode through the buried oxide layer to the semiconductor substrate; and
an interconnect coupling the transistor and the diode.

2. The silicon-on-insulator device of claim 1 wherein the buried oxide layer electrically isolates the transistor from the semiconductor substrate.

3. The silicon-on-insulator device of claim 1, wherein said conductive path is electrostatically conductive.

4. The silicon-on-insulator device of claim 1 further comprising a first gate stack disposed on said first semiconductor region and a second gate stack disposed on said second semiconductor region.

5. The silicon-on-insulator device of claim 4, wherein said first gate stack and said second gate stack comprises a gate dielectric layer and a gate electrode.

6. The silicon-on-insulator device of claim 4, wherein said first and second semiconductor regions comprise a set of diffusion regions.

7. The silicon-on-insulator device of claim 4, wherein said second semiconductor region has a depth of approximately 100 nm.

8. silicon-on-insulator device of claim 6, wherein the diode comprises said set of diffusion regions and said first gate stack.

* * * * *